United States Patent [19]

Herberg

[11] Patent Number: 4,758,871

[45] Date of Patent: Jul. 19, 1988

[54] THYRISTOR WITH MULTIPLE GROUPS OF INSULATED CONTROL ELECTRODES

[75] Inventor: Helmut Herberg, Munich, Fed. Rep. of Germany

[73] Assignee: Siemens Aktiengesellschaft, Berlin and Munich, Fed. Rep. of Germany

[21] Appl. No.: 104,577

[22] Filed: Oct. 2, 1987

Related U.S. Application Data

[63] Continuation of Ser. No. 622,125, Jun. 19, 1984, abandoned.

[30] Foreign Application Priority Data

Aug. 19, 1983 [DE] Fed. Rep. of Germany ....... 3330022

[51] Int. Cl.$^4$ ............................................. H01L 29/74
[52] U.S. Cl. ........................................ 357/38; 357/20; 357/23.4; 357/23.12; 357/23.14; 357/36; 357/43; 357/68; 357/86
[58] Field of Search ..................... 357/20, 36, 38, 23.4, 357/23.14, 43, 86, 68, 23.12

[56] References Cited

U.S. PATENT DOCUMENTS

| | | | |
|---|---|---|---|
| 4,224,634 | 9/1980 | Svedberg | 357/38 |
| 4,454,527 | 6/1984 | Patalong | 357/38 |
| 4,466,010 | 8/1984 | Patalong | 357/38 |
| 4,639,762 | 1/1987 | Neilson et al. | 357/23.4 |

FOREIGN PATENT DOCUMENTS 2945366 5/1981 Fed. Rep. of Germany.
3118354 11/1982 Fed. Rep. of Germany.

Primary Examiner—Joseph E. Clawson, Jr.
Attorney, Agent, or Firm—Hill, Van Santen, Steadman & Simpson

[57] ABSTRACT

A thyristor comprising a semiconductor body which has a plurality of emitter zones formed by parts of a first electrode, a first base adjacent to the emitter zones, an emitter contacted by a second electrode, and a second base adjacent to the emitter and adjacent to the first base. Emitter shorts which are controllable via MIS field effect transistors of the depletion type are positioned at the edge side relative to the emitter zones. It is an objective to obtain thyristors of this type that are usable despite some fault locations. This is achieved by combining the emitter zones into a plurality of groups which have group-associated control terminals for the MIS-FETs. Only the control terminals of the functional groups are connected to a collective contact carrying a control voltage. The control terminals of the fault-affected groups are not connected thereto so that the latter groups are functionally suppressed.

4 Claims, 2 Drawing Sheets

THYRISTOR WITH MULTIPLE GROUPS OF INSULATED CONTROL ELECTRODES

This is a continuation of application Ser. No. 622,125, filed June 19, 1984, now abandoned.

BACKGROUND OF THE INVENTION

The invention relates to a thyristor formed of a semiconductor body with a plurality of n-emitter zones provided with corresponding cathode parts. A p-base adjacent to the n-emitter zones is provided along with a p-emitter contacted by an anode. An n-base is provided between the p-emitter and the p-base. Controllable emitter shorts are provided at a boundary surface of the semiconductor comprising MIS field effect transistors of a depletion type, said emitter shorts being provided at edges of the n-emitter zones.

Such thyristors are known, for example, from German OS No. 29 45 366 A1 and German OS No. 31 18 354 A1, respectively corresponding to U.S. Ser. Nos. 199,633 filed Oct. 22, 1980 and 370,497 filed Apr. 24, 1982, both incorporated herein by reference. A common control voltage terminal is respectively provided via which a gate voltage is supplied to the MIS structures. In case such a thyristor has fault locations such as holes or weak points in the gate oxide, then the gate voltage applied when triggering collapses due to the short-circuit existing at the fault locations. As a consequence, the controllable emitter shorts constantly remain in effect and the thyristor can no longer be triggered. The density of fault locations is usually so high that a selection of faultless units would lead to a very low yield, particularly in the case of large-surface thyristors.

SUMMARY OF THE INVENTION

An object of the invention is to specify a thyristor of the type initially cited wherein one or more fault locations can be tolerated without the thyristor being excluded from use. This is achieved by means of designing the thyristor such that the n-emitter zones are combined into groups and gate terminals of the MIS field effect transistors in each such group being connected to a common terminal. A collective contact is provided to which a gate voltage for controlling the field effect transistors is connected. The common terminals of those groups of emitter zones with their corresponding controllable emitter shorts which prove functional at a function check are connected to the collective contact. On the other hand, the common terminals of those groups of emitter zones with their controllable emitter shorts which prove non-functional in the function check are not connected to the collective contact.

The advantage obtainable with the invention is that only those groups of emitter zones in whose regions there are fault locations are switched off whereas the remaining groups remain functional. Accordingly, it is only the current loadability of the thyristor which is reduced because of the failure of one or more groups of emitter zones and the restriction of the current-carrying cross-section to the remaining emitter zones as reduced in accordance with the number and disposition of the fault locations. The thyristor of the invention remains functional despite the presence of these fault locations.

DESCRIPTION OF THE PREFERRED EMBODIMENTS

Figure 1:
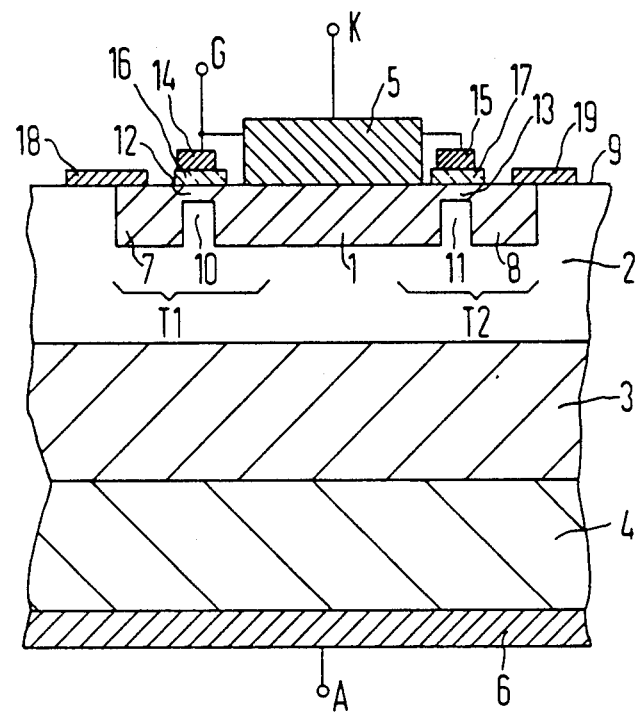
FIG. 1 is a cross-section of a prior art thyristor provided with controllable emitter shorts.

The thyristor according to FIG. 1 is comprised of a body of doped semiconductor material, for example Si, having a plurality of successive layers with alternating conductivity types. 1 thus indicates an n-emitter zone that is inserted into a p-base 2. This is followed by an n-base 3, whereas the lowest layer 4 is referred to as a p-emitter. The n-emitter zone is contacted by a cathode or by a cathode part or portion 5 comprising electrically conductive material, for example Al, which is provided with a terminal K, whereas the p-emitter 4 is contacted by an anode 6 which is comprised of an electrically conductive material, for example Al, and which has a terminal A.

Inserted into the p-base 2 at both sides of the n-emitter zone are n-conductive semiconductor regions 7 and 8 which extend up to the boundary surface 9 of the semiconductor body. A width of the sub-regions 10 and 11 of the p-base 2 define the spacing of the semiconductor regions 7 and 8 from the n-emitter zone 1. These sub-regions 10 and 11 are provided with an n-doping at the boundary surface 9, so that two n-conductive channels 12 and 13 which connect the parts 1 and 7 or 1 and 8 to one another are formed. The channels 12 and 13 can, for example, be generated by means of an implantation of arsenic ions, whereby a dosage of $10^{13}/cm^2$ is implanted with an energy of about 80 KeV. The channels are covered by gate electrodes 14, 15 which are separated from the semiconductor body by thin, electrically non-conductive layers 16, 17 comprising for example, $SiO_2$. The gate electrodes 14, 15 are comprised of electrically conductive material, for example highly doped, polycrystalline silicon, and are connected to a common terminal G. Conductive coatings 18, 19 bridge the pn-junctions between the p-base 2 and the semiconductor regions 7 and 8 at the sides of the latter facing away from the sub-regions 10, 11.

The left edge region of the n-emitter zone 1 represents the drain region and the semiconductor region 7 represents the source region of a MIS field effect transistor of the depletion type T1 which also comprises an n-conductive channel 12 which is covered by the gate electrode 14. In an analogous fashion, the right edge region of 1 together with the parts 8, 13, 15 and 17 form a MIS field effect transistor T2. The n-channels 12 and 13 exist when no voltage is applied to terminal G. When, by contrast, a sufficiently high negative gate voltage is applied to G, then the channels 12, 13 are switched to a high-resistance, i.e. ineffective. T1 and T2 thus represent switches which connect the n-emitter zone 1 to the semiconductor regions 7 and 8 and, further, to the p-base 2 via the coatings 18 and 19 which are low-resistance in a first switch status (no voltage at terminal G). In a second switch status (negative voltage at G), this low-resistance connection is then interrupted or switched to a high-resistance. Together with the conductive coating 18, T1 thus represents a first controllable emitter short and T2, together with the coating 19, represents a second controllable emitter short.

The thyristor of FIG. 1 is provided with a plurality of preferably strip-like designed n-emitter zones 1 which, for example, are aligned perpendicular to the plane of the drawing and parallel to one another. The individual emitter zones are thus provided with allocated cathode parts 5 that are conductively interconnected to one another. Each of the n-emitter zones is provided with edge-side emitter shorts in the manner described and presented, these likewise being designed in strip-like fashion and being oriented perpendicular to the plane of the drawing.

In operation, the gate terminal G remains disconnected from voltages before the respective trigger time, i.e. in the inhibited condition of the thyristor. The n-emitter zones 1 are thus connected in low-resistance fashion to the p-base 2, this stabilizing the thyristor against unintentional trigger operations. A gate trigger current pulse is supplied via an initiating electrode for triggering. Simultaneously, the terminal G has a negative voltage pulse applied thereto for the duration of the trigger operation which suppresses the n-channels 12, 13, etc. This significantly increases the trigger sensitivity. After triggering has been accomplished, a load current of a load circuit connected at A and K then flows across the thyristor now switched to low-resistance. The shutoff of the thyristor is achieved by means of a disconnection of the voltage between A and K or, given an adjacent alternating current, by the next zero-axis crossing thereof.

Figure 2:
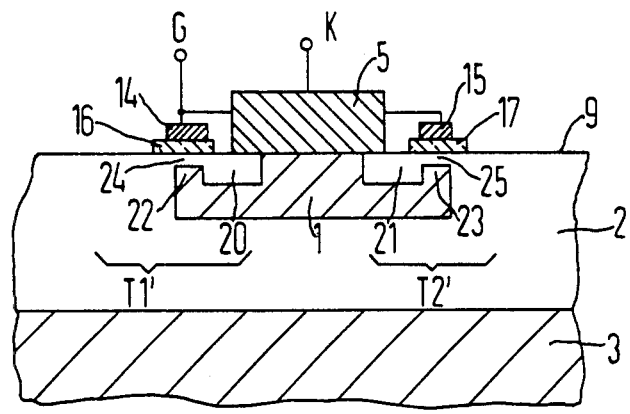
FIG. 2 is a cross-section of another prior art thyristor whose controllable emitter shorts are designed in alternative fashion compared to FIG. 1.

FIG. 2 shows a prior art thyristor which differs from FIG. 1 in that its controllable emitter shorts are designed in a different manner. It comprises structural parts that have already been described with reference to FIG. 1 and which are provided with the same reference characters. Thus, p-conductive semiconductor regions 20 and 21 are inserted into the edge regions of the n-emitter zone 1 such that they extend up to the boundary surface in which they are contacted by the cathode part 5. The edge parts or regions 22, 23 of the emitter zone 1 (the width of the edge parts define the spacing of the semiconductor regions 20, 21 from the edge of the emitter zone 1) are provided with a p-doping at the boundary surface 9 so that two p-conductive channels 24, 25 which connect the parts 2 and 20 or 2 and 21 to one another arise. The channels 24, 25 can, for example, be generated by means of an implantation of boron ions which are introduced with a dosage of $10^{13}/cm^2$ and an energy of 80 KeV. The sub-region of the p-base 2 bordering the emitter zone 1 thus forms the source region and the region 20 forms the drain region of an MIS field effect transistor T1' which also comprises a p-channel 24, a gate electrode 14, and a gate insulation layer 16. Analogously thereto, the parts 2, 21, 25, 15, and 17 form a second transistor T2'. The switch functions of T1 and T2 correspond to the switch functions of T1 and T2 already described with reference to FIG. 1, whereby a positive voltage pulse is supplied to the terminal G for the duration of the ignition operation.

Figure 3:
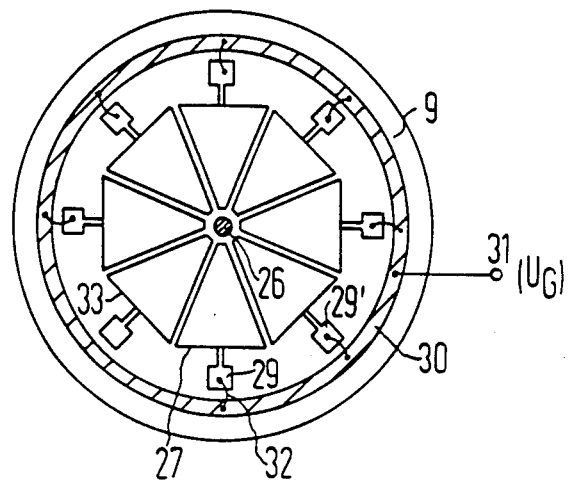
FIG. 3 is a thyristor according to FIG. 1.
Figure 4:
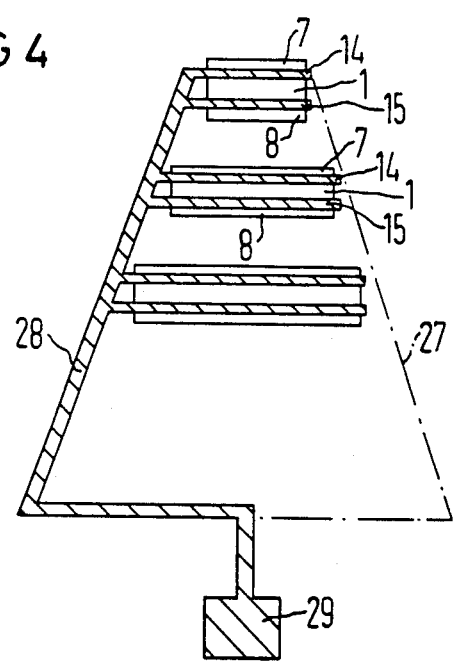
FIG. 4 is a structural detail relating to FIG. 3.

FIG. 3 shows a thyristor designed according to the invention in plan view, whereby the cathode parts 5 have been omitted for reasons of greater clarity. The visible boundary surface 9 which comprises a round, outer limitation is contacted by a central initiating electrode 26. A plurality of n-emitter zones 1 designed in accordance with FIG. 1 are combined into individual groups which are disposed on the boundary surface such that each group occupies a region of the p-base indicated by means of a trapezoidal border 27. FIG. 4 shows in detail how a plurality of n-emitter zones 1, the n-conductive semiconductor regions 7 and 8 flanking them, and the corresponding gate electrodes 14 and 15 are distributed on a semiconductor surface defined by the border 27. A plurality of mutually parallel emitter zones 1 are thus provided and are positioned parallel to the mutually parallel sides of the border 27. The gate electrodes 14, 15 of all corresponding field effect transistors are connected to an interconnect or conducting path 28 which leads to a common terminal 29. The interconnect 28, as terminal 29, and the gate electrodes 14 are separated from the boundary surface 9 of the semiconductor body by an insulating layer.

Given the exemplary embodiment of the invention shown in FIG. 3, eight groups of n-emitter zones 1 are provided, these respectively lying within border 27. These groups are disposed next to one another such that they cover a part of the thyristor surface which surrounds the central initiating electrode 26 and has an outer limit in the manner of a polygon. A collective or common contact 30 is provided outside of the common terminals 29 of all groups. This collective or common contact is realized, for example, as an annular interconnect which is electrically insulated from the p-base by an insulating layer of, for example, $SiO_2$. The collective contact is provided with a terminal 31 to which a gate voltage $U_G$ is supplied.

One now proceeds such that the thyristor is subjected to a function check after the fabrication of the structure described up to now, the initiating electrode 26 being supplied with a positive gate trigger current pulse and a negative voltage pulse $U_G$ simultaneously applied to one of the common terminals 29 in the function check. When the group of n-emitter zones whose emitter shorts can be reached via this common terminal 29 is functional, then the shorts can be suppressed by means of the voltage pulse $U_G$, the thyristor thereby triggering. The ensuing ignition is identified, for example, by means of a voltmeter which is connected between the terminals A and K and which displays a significantly lower voltage level given a triggered thyristor than in the blocked or inhibited state thereof. When the triggerability of the thyristor given drive via a common terminal 29 has been determined, then this terminal is permanently connected to the collective contact 30 via a connecting line 32. The function check is subsequently repeated while supplying a further gate trigger current pulse and a further voltage pulse $U_G$ to a different common terminal 29', the latter being likewise connected to the collective contact 30 given functionability of the emitter shorts that are reachable via the terminal 29'.

After all groups of n-emitter zones 1 have been checked in this manner, all common terminals 29, 29', etc. where functionability has been determined are connected to 30. Those groups that were found to be non-functional as a consequence of a fault location are not connected to the collective contact 30.

In FIG. 3, only one such faulty group has been indicated with 33.

During operation, the thyristor of FIG. 3 is charged with a gate trigger current pulse supplied via 26 and with a negative voltage pulse $U_G$ supplied to the terminal 31 for triggering. It thus triggers in the region of all functional n-emitter groups, whereas the non-functional groups, for example 33 in FIG. 3, do not belong to the current-carrying part of the thyristor cross-section due to the emitter shorts which remain effective. This, however, only means a slightly reduced current loadability of the thyristor (by ½ in FIG. 3) and it remains usable. When the emitter shorts are designed in accordance with FIG. 2, then a positive voltage pulse is supplied to the terminal 31.

Instead of the n-emitter, the p-emitter can also be divided into individual p-emitter zones which are contacted by individual parts of the anode which are conductively interconnected to one another. Controllable p-emitter shorts then exist. The Figures can be employed for the illustration of this modification when the designations of the terminals A and K are interchanged, the illustrated semiconductor regions have the respectively opposite conductivities to those hitherto described, and the currents or voltages are supplied with respectively opposite polarities.

Other desired configurations are possible in addition to the configurations of the individual emitter zones and emitter zone groups shown in FIGS. 3 and 4. Thus, for example, groups can be provided which respectively occupy rectangular sub-regions of the base adjacent to the emitter zones. Furthermore, these rectangular sub-regions can be aligned in terms of rows and columns.

Although various minor changes and modifications might be proposed by those skilled in the art, it will be understood that I wish to include within the claims of the patent warranted hereon all such changes and modifications as reasonably come within my contribution to the art.

I claim as my invention:

1. A thyristor, comprising:
 a first conductivity type emitter connected to an anode terminal;
 a second conductivity type first base directly adjacent to and contacting said emitter;
 a first conductivity type second base directly adjacent to and contacting said first base such that said first base lies between said second base and said emitter;
 a plurality of second conductivity type emitter zones each provided with corresponding cathode portions connected to a cathode terminal and arranged in the second base;
 a plurality of emitter groups being provided in respective second base regions, each emitter group being formed of a plurality of said emitter zones;
 a central initiating electrode contacting the second base and surrounded by said emitter groups;
 each emitter zone having a flanking second conductivity type region connected by a second conductivity type channel region, a conductive coating bridging a pn junction between the second base and flanking region, and a gate electrode lying on a non-conductive layer over the channel region;
 for each emitter group all of the gates associated therewith being commonly connected by a conductive path to a common terminal, the conductive path and common terminal being insulated from the second base;
 a common contact insulated from the second base and surrounding the emitter groups and associated common terminals, and said common terminals lying adjacent to but separated from the common contact; and
 an electrical connection running from the group common terminal of selected emitter groups to the adjacent common contact,
 whereby any emitter group which is determined to be non-functional need not be selected to be connected to the common contact.

2. A thyristor according to claim 1 wherein the emitter zones in each emitter group are strip-shaped and each emitter zone has first and second parallel gate electrode strips arranged thereover.

3. A thyristor according to claim 1 wherein each emitter group occupies a trapezoidal-shaped region of the second base and wherein each emitter group has a plurality of strip-shaped emitter regions of increasing length running from a top of the trapezoidal region to a bottom of the trapezoidal region.

4. A thyristor, comprising:
 a first conductivity type emitter connected to an anode terminal;
 a second conductivity type first base directly adjacent to and contacting said emitter;
 a first conductivity type second base directly adjacent to and contacting said first base such that said first base lies between said second base and said emitter;
 a plurality of second conductivity type emitter zones each provided with corresponding cathode portions connected to a cathode terminal and arranged in the second base;
 a plurality of emitter groups being provided in respective second base regions, each emitter group being formed of a plurality of said emitter zones;
 a central initiating electrode contacting the second base and surrounded by said emitter groups;
 each emitter zone having a first conductivity type region in an edge region thereof which is connected by a first conductivity type channel region to the second base, and a gate electrode lying on a non-conductive layer over the channel region;
 for each emitter group all of the gates associated therewith being commonly connected by a conductive path to a common terminal, the conductive path and common terminal being insulated from the second base;
 a common contact insulated from the second base and surrounding the emitter groups and their respective common terminals, and said common terminals lying adjacent to but separated from the common contact; and
 an electrical connection running from the group common terminal of selected emitter groups to the adjacent common contact,
 whereby any emitter group which is determined to be non-functional need not be selected to be connected to the common contact.

* * * * *